(12) United States Patent
Wang et al.

(10) Patent No.: US 11,486,461 B2
(45) Date of Patent: Nov. 1, 2022

(54) SELF-POWERED VIBRATION DAMPER BASED ON PIEZOELECTRICITY AND CONTROL METHOD THEREOF

(71) Applicant: Shanghai University, Shanghai (CN)

(72) Inventors: Min Wang, Shanghai (CN); Dong Zhang, Shanghai (CN); Jun Luo, Shanghai (CN); Huayan Pu, Shanghai (CN); Yi Sun, Shanghai (CN); Chaoqun Duan, Shanghai (CN); Shunqi Zhang, Shanghai (CN); Yan Peng, Shanghai (CN); Shaorong Xie, Shanghai (CN)

(73) Assignee: Shanghai University, Shanghai (CN)

( * ) Notice: Subject to any disclaimer, the term of this patent is extended or adjusted under 35 U.S.C. 154(b) by 391 days.

(21) Appl. No.: 16/711,750

(22) Filed: Dec. 12, 2019

(65) Prior Publication Data

US 2021/0088104 A1 Mar. 25, 2021

(30) Foreign Application Priority Data

Sep. 23, 2019 (CN) .......................... 201910898315.5

(51) Int. Cl.
*F16F 15/00* (2006.01)
*F16F 13/00* (2006.01)
(Continued)

(52) U.S. Cl.
CPC ............ *F16F 15/007* (2013.01); *F16F 13/00* (2013.01); *F16F 15/022* (2013.01);
(Continued)

(58) Field of Classification Search
CPC ...... F16F 15/002; F16F 15/007; F16F 15/022; F16F 13/00; H01L 41/042; H01L 41/04;
(Continued)

(56) References Cited

U.S. PATENT DOCUMENTS

| 7,170,201 | B2 * | 1/2007 | Hamel | H02N 2/186 |
| | | | | 307/151 |
| 7,365,455 | B2 * | 4/2008 | Hamel | H02J 7/345 |
| | | | | 307/151 |

(Continued)

FOREIGN PATENT DOCUMENTS

| CN | 105134866 A | * 12/2015 | |
| CN | 106678241 A | * 5/2017 | |
| WO | WO-2019229318 A1 | * 12/2019 | ............. H02N 2/186 |

*Primary Examiner* — Thomas J Williams
(74) *Attorney, Agent, or Firm* — Troutman Pepper Hamilton Sanders LLP; Christopher C. Close, Jr.

(57) ABSTRACT

Disclosed is a self-powered vibration damper based on piezoelectricity and a control method. The damper comprises a loading platform, an energy collecting mechanism, a curved leaf spring, a vibration control mechanism and a substrate all connected in sequence, the circuit system comprises a rectifier circuit, a DC-DC voltage conversion circuit, an energy storage circuit, a control circuit and a charging battery, a first piezoelectric stack is connected with the input end of the rectifier circuit, the output end of the rectifier circuit is connected with the input end of the DC-DC voltage conversion circuit, the output end of the DC-DC voltage conversion circuit is connected with the input ends of the energy storage circuit and the charging battery, the output end of the energy storage circuit is connected with the input end of the control circuit, the output end of the control circuit is connected with the second piezoelectric stack.

16 Claims, 10 Drawing Sheets

(51) Int. Cl.
  *H01L 41/053* (2006.01)
  *H01L 41/09* (2006.01)
  *H01L 41/08* (2006.01)
  *F16F 15/02* (2006.01)
  *H01L 41/04* (2006.01)
  *H02J 7/00* (2006.01)
  *H02N 2/00* (2006.01)

(52) U.S. Cl.
  CPC .......... *H01L 41/042* (2013.01); *H01L 41/053* (2013.01); *H01L 41/08* (2013.01); *H01L 41/09* (2013.01); *H02J 7/0068* (2013.01); *H02N 2/006* (2013.01); *H02N 2/0075* (2013.01)

(58) Field of Classification Search
  CPC ....... H01L 41/09; H01L 41/053; H01L 41/08; H02N 2/181; H02N 2/186; H02N 2/006; H02N 2/0075
  See application file for complete search history.

(56) References Cited

U.S. PATENT DOCUMENTS

| | | | | |
|---|---|---|---|---|
| 7,429,805 B2 * | 9/2008 | Hamel | ................... | H02N 2/186 |
| | | | | 307/9.1 |
| 8,674,663 B2 * | 3/2014 | Ivanov | ................. | H02M 7/219 |
| | | | | 320/137 |
| 9,941,722 B2 * | 4/2018 | Ivanov | ...................... | H02J 7/04 |
| 2004/0078662 A1 * | 4/2004 | Hamel | ..................... | H02J 7/32 |
| | | | | 714/22 |
| 2005/0017602 A1 * | 1/2005 | Arms | ................. | B60C 23/0411 |
| | | | | 310/339 |

* cited by examiner

SELF-POWERED VIBRATION DAMPER BASED ON PIEZOELECTRICITY AND CONTROL METHOD THEREOF

TECHNICAL FIELD

The present invention relates to the technical field of vibration abatement, and in particular, to a self-powered vibration damper based on piezoelectricity and a control method thereof.

BACKGROUND

Piezoelectric materials are widely applied in the intelligence of structure and the vibration noise control through the high-frequency response characteristic and electromechanical coupling characteristic of the piezoelectric materials. Previously, a great number of researches are carried out on all kinds of control methods. More active methods and passive methods are researched, and theories are also relatively mature.

Active control is of preferable control effect, but generally, signal processing systems such as a sensor, a driver and a charge amplifier and external equipment such as the charge amplifier are needed, the cost is high, the system is relatively huge and complex, the reliability of the system is reduced, and miniaturization and light weight of the system are difficult to realize. In the passive control method, mechanical energy generated by structural vibration is dissipated or absorbed by serially connecting appropriate external branch circuits between the surface electrodes of a piezoelectric element. Passive control is relatively simple and easy to realize, but the control performance of passive control is relatively low, the adaptive capacity of inductance and resistance parameters in the branch circuits on environmental change is low, greater inductance is needed for low-frequency vibration frequently, a common solution is to use an active circuit to simulate inductance, but the circuit system becomes huge, and an extra power supply is needed.

In order to overcome the disadvantage of the method, various semi-active control methods are proposed by people. The electromechanical conversion energy is improved through an electronic circuit mainly in traditional piezoelectric semi-active control so as to increase the damping effect, the system is simplified and preferable in effect, but an extra battery is needed for supplying power for a logic circuit, the energy of piezoelectric conversion is mainly used for dissipation to cause the waste of energy, simultaneously, the energy of piezoelectric conversion is mainly used for vibration control of a thin-walled structure, so that the application field is greatly restricted.

SUMMARY

In order to solve the technical problem, the present invention provides a self-powered vibration damper based on piezoelectricity and a control method thereof. The vibration damper is small in structure and self-powered completely, has front feedback characteristic and self-adaptive damping characteristic, and can realize vibration damping and vibration isolation functions.

To achieve the above purpose, the present invention provides the following technical solutions:

The present invention provides a self-powered vibration damper based on piezoelectricity, where the self-powered vibration damper includes a circuit system and a loading platform, an energy collecting mechanism, a curved leaf spring, a vibration control mechanism and a substrate which are connected from top to bottom in sequence, the energy collecting mechanism includes a first mechanical amplifying mechanism and a first piezoelectric stack installed inside the first mechanical amplifying mechanism, and the vibration control mechanism includes a second mechanical amplifying mechanism and a second piezoelectric stack installed inside the second mechanical amplifying mechanism; the circuit system includes a rectifier circuit, a DC-DC voltage conversion circuit, an energy storage circuit, a control circuit and a charging battery, the first piezoelectric stack is connected with the input end of the rectifier circuit, the output end of the rectifier circuit is connected with the input end of the DC-DC voltage conversion circuit, the output end of the DC-DC voltage conversion circuit is connected with the input ends of the energy storage circuit and the charging battery, the output end of the energy storage circuit is connected with the input end of the control circuit, the output end of the control circuit is connected with the second piezoelectric stack, and the charging battery is used for supplying power for the rectifier circuit, the DC-DC voltage conversion circuit, the energy storage circuit and the control circuit.

Preferably, the first mechanical amplifying mechanism and the second mechanical amplifying mechanism are of hexagonal frame structures respectively.

Preferably, the upper surface of the first mechanical amplifying mechanism is connected with the loading platform through screws, and the lower surface of the first mechanical amplifying mechanism is connected with the upper surface of the curved leaf spring through screws.

Preferably, the first piezoelectric stack is installed at the middle part of the first mechanical amplifying mechanism, and the first piezoelectric stack and the loading platform are arranged in parallel.

Preferably, the upper surface of the second mechanical amplifying mechanism is connected with the lower surface of the curved leaf spring through screws, and the lower surface of the second mechanical amplifying mechanism is connected with the substrate through screws.

Preferably, the second piezoelectric stack is installed at the middle part of the second mechanical amplifying mechanism, and the second piezoelectric stack and the loading platform are arranged in parallel.

Preferably, the substrate includes a base platform and a chassis, the chassis is fixed onto the base platform through screws, and the second mechanical amplifying mechanism is fixed onto the chassis through screws.

Preferably, the circuit system further includes a first external interface card and a second external interface card, the first piezoelectric stack is connected with the input end of the rectifier circuit through the first external interface card, and the output end of the control circuit is connected with the second piezoelectric stack through the second external interface card.

The present invention further provides a control method of the self-powered vibration damper based on piezoelectricity, where the control method includes the following steps: when the loading platform is excited by an external environment, exciting force is amplified to the first piezoelectric stack through the first mechanical amplifying mechanism, and when the first piezoelectric stack is deformed to the maximum value, the circuit system is conducted; the rectifier circuit is used for converting alternating current of energy conversion into direct current, the DC-DC voltage conversion circuit is matched with the voltage of a subsequent circuit through voltage conversion, the storage of energy is completed by the energy storage circuit, after the storage is completed, the control circuit is used for enabling the stored energy to be used for the vibration control of the second piezoelectric stack through a switch control law, namely, a logic switch is controlled to realize energy collection when the maximum deformation of the first piezoelectric stack occurs, and the logic switch is controlled to realize energy release when the maximum deformation of the second piezoelectric stack occurs; the charging battery can obtain partially converted energy and is used for supplying power for the rectifier circuit, the DC-DC voltage conversion circuit, the energy storage circuit and the control circuit; and when the displacement of the vibration control mechanism reaches the extreme value, the circuit system is disconnected, and then the control for one cycle is completed.

Compared with the prior art, the present invention has the following technical effects:

According to the self-powered vibration damper based on piezoelectricity and the control method thereof provided by the invention, the self-powered vibration damping of the system is realized, the mechanical vibration energy is dissipated through piezoelectric energy conversion, converted energy is stored and reused, on one hand, power is supplied for a logic circuit, on the other hand, active vibration damping is realized, the damping effect of the system is further increased, and the vibration damping effect is improved. The vibration damper is of a certain front feedback effect by setting a curved leaf spring, simultaneously, the vibration damper is of certain adaptivity, the higher the shock excitation effect of external environment is, the greater the electromechanical conversion energy is, the more the energy used for vibration control is, and the damping is also strengthened. The vibration damper in the present invention can realize vibration resistance and vibration isolation functions, can be applied onto the vibration abatement of some precision sensors (such as radars and precision cameras), and also can be applied to vibration and noise control of some actuators (such as motors), so that the limitation of traditional piezoelectric semi-active control application is overcome. The vibration damper in the present invention further can be used as a single-leg mechanism to expand the multi-degree-of-freedom, so as to be used as a multi-degree-of-freedom platform to realize multi-degree-of-freedom vibration suppression.

BRIEF DESCRIPTION OF THE DRAWINGS

To describe the technical solutions in the embodiments of the present invention or in the prior art more clearly, the following briefly introduces the accompanying drawings required for describing the embodiments. Apparently, the accompanying drawings in the following description show merely some embodiments of the present invention, and a person of ordinary skill in the art may still derive other drawings from these accompanying drawings without creative efforts.

Figure 1:
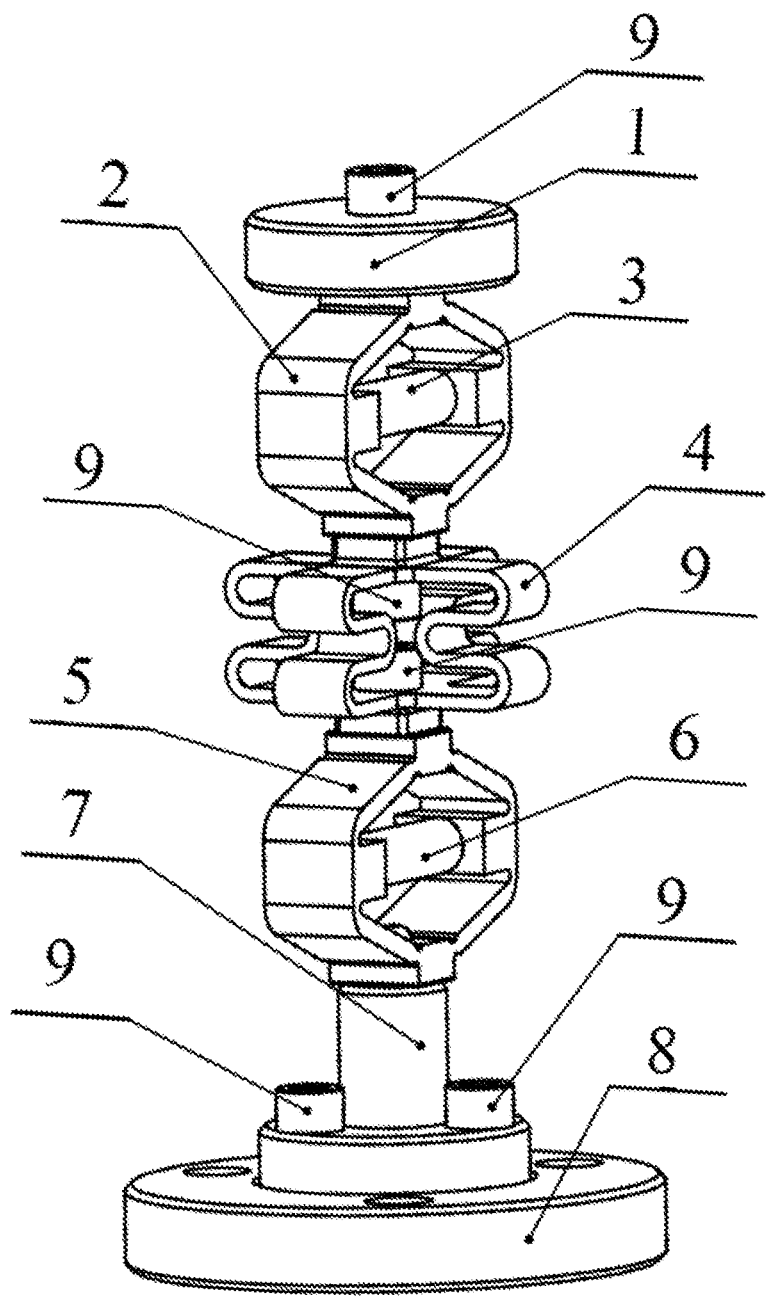
FIG. 1 is a structure diagram of a self-powered vibration damper based on piezoelectricity provided by the present invention.
Figure 2:
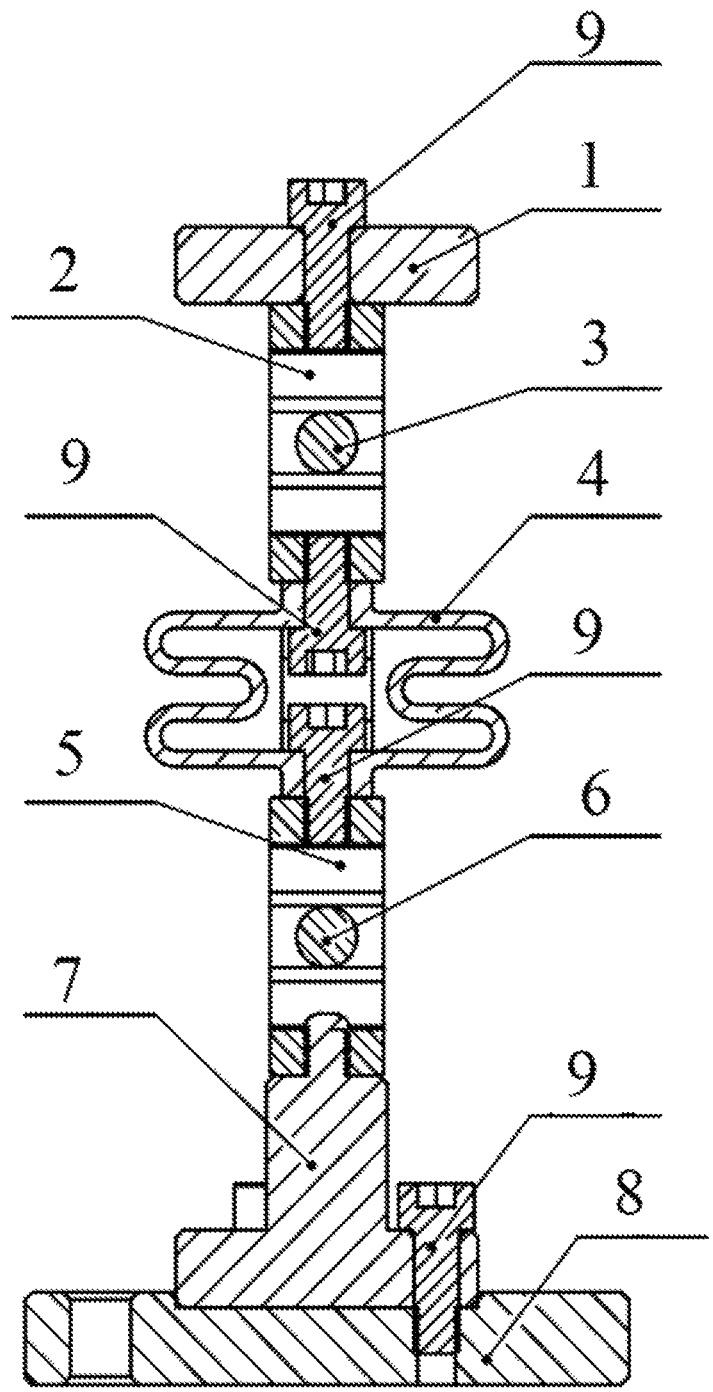
FIG. 2 is a section view of the self-powered vibration damper based on piezoelectricity provided by the present invention.
Figure 3:
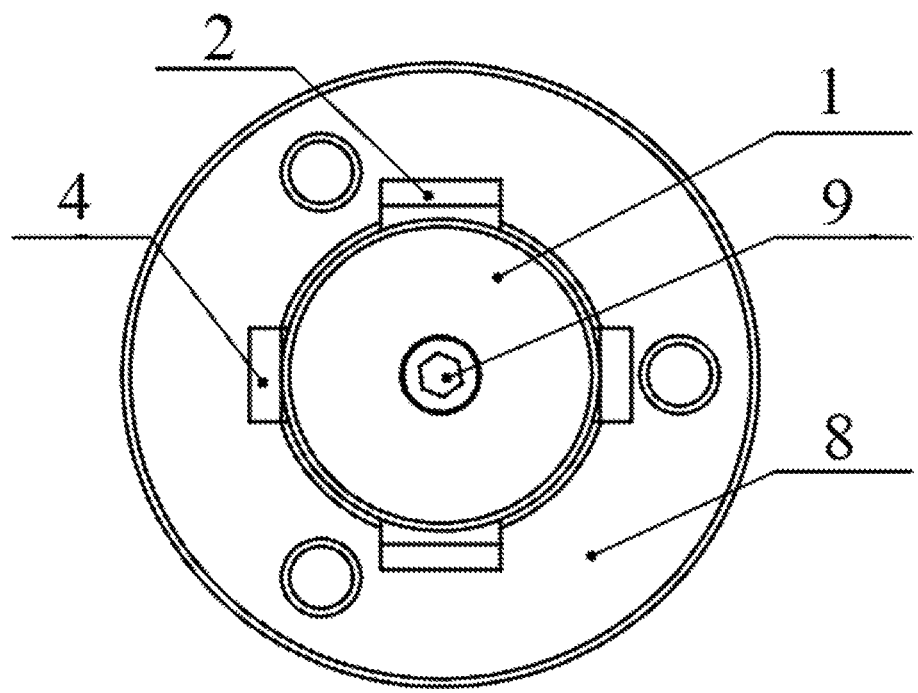
FIG. 3 is a top view of the self-powered vibration damper based on piezoelectricity provided by the present invention.
Figure 4:
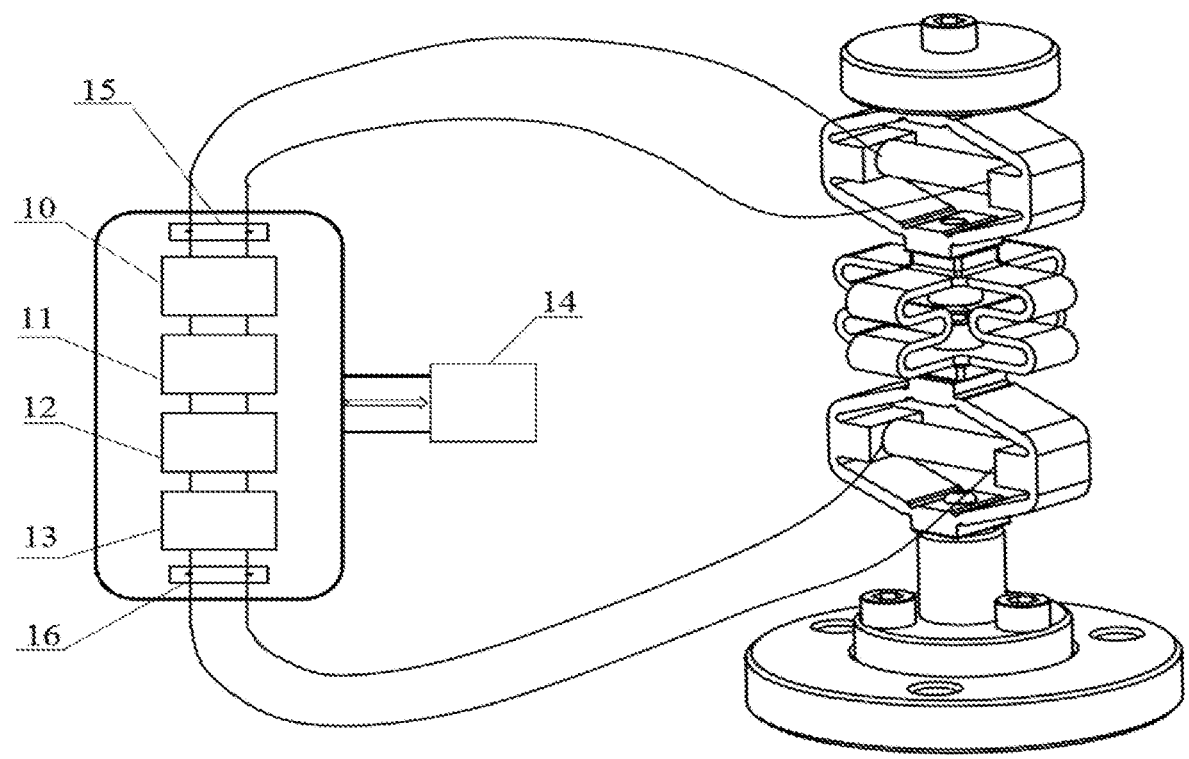
FIG. 4 is a schematic diagram of the self-powered vibration damper based on piezoelectricity provided by the present invention.
Figure 5:
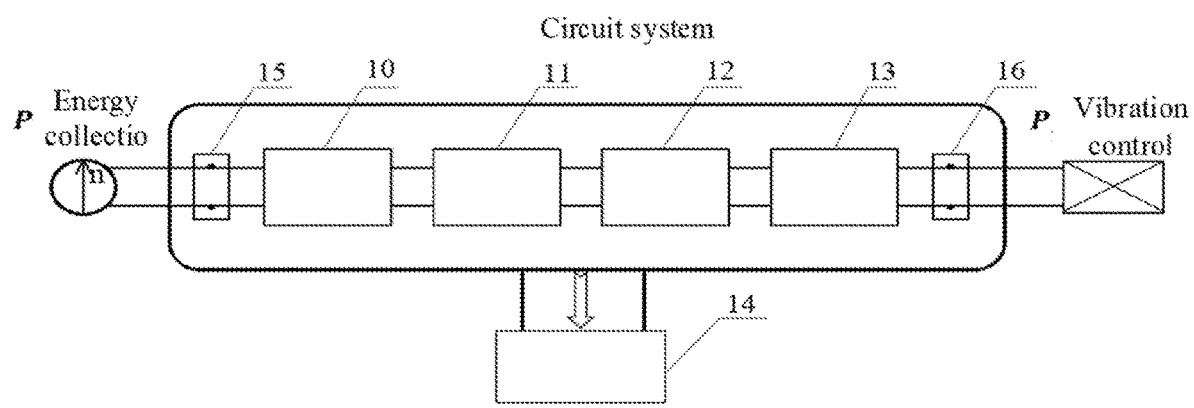
FIG. 5 is a connection schematic diagram of a circuit system in the present invention.
Figure 6:
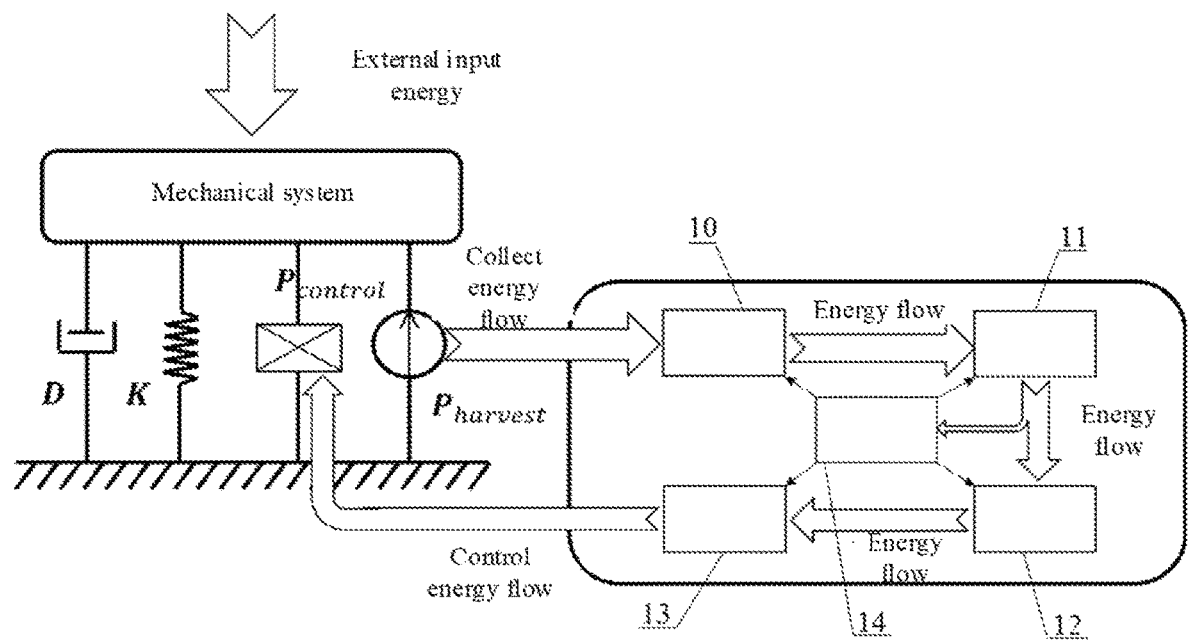
FIG. 6 is an energy flow analysis chart of the system in the present invention.

Mark illustration of figures: 1, loading platform; 2, first mechanical amplifying mechanism; 3, first piezoelectric stack; 4, curved leaf spring; 5, second mechanical amplifying mechanism; 6, second piezoelectric stack; 7, chassis; 8, base platform; 9, screw; 10, rectifier circuit; 11, DC-DC voltage conversion circuit; 12, energy storage circuit; 13, control circuit; 14, charging circuit; 15, first external interface card; and 16, second external interface card.

DETAILED DESCRIPTION

The following clearly and completely describes the technical solutions in the embodiments of the present invention with reference to the accompanying drawings in the embodiments of the present invention. Apparently, the described embodiments are merely a part rather than all of the embodiments of the present invention. All other embodiments obtained by a person of ordinary skill in the art based on the embodiments of the present invention without creative efforts shall fall within the protection scope of the present invention.

The present invention aims to provide a self-powered vibration damper based on piezoelectricity and a control method thereof. The vibration damper is small in structure and self-powered completely, has front feedback characteristic and self-adaptive damping characteristic, and can realize vibration damping and vibration isolation functions.

To make the foregoing objective, features, and advantages of the present invention clearer and more comprehensible, the present invention is further described in detail below with reference to the accompanying drawings and specific embodiments.

As shown in FIG. 1 to FIG. 6, the embodiment provides a self-powered vibration damper based on piezoelectricity. The self-powered vibration damper includes a circuit system and a loading platform 1, an energy collecting mechanism, a curved leaf spring 4, a vibration control mechanism and a substrate which are connected from top to bottom in sequence, the energy collecting mechanism includes a first mechanical amplifying mechanism 2 and a first piezoelectric stack 3 installed inside the first mechanical amplifying mechanism 2, the first piezoelectric stack 3 is embedded into the first mechanical amplifying mechanism 2 and a pretightening force is applied in advance, a plurality of first piezoelectric stacks 3 can be embedded into the first mechanical amplifying mechanism 2, the vibration control mechanism includes a second mechanical amplifying mechanism 5 and a second piezoelectric stack 6 installed inside the second mechanical amplifying mechanism 5, the second piezoelectric stack 6 is embedded into the second mechanical amplifying mechanism 5 and a pretightening force is applied in advance, and a plurality of second piezoelectric stacks 6 can be embedded into the second mechanical amplifying mechanism 5; the circuit system includes a rectifier circuit 10, a DC-DC voltage conversion circuit 11, an energy storage circuit 12, a control circuit 13 and a charging battery 14, the first piezoelectric stack 3 is connected with the input end of the rectifier circuit 10, the output end of the rectifier circuit 10 is connected with the input end of the DC-DC voltage conversion circuit 11, the output end of the DC-DC voltage conversion circuit 11 is connected with the input ends of the energy storage circuit 12 and the charging battery 14, the output end of the energy storage circuit 12 is connected with the input end of the control circuit 13, the output end of the control circuit 13 is connected with the second piezoelectric stack 6, and the charging battery 14 is used for supplying power for the rectifier circuit 10, the DC-DC voltage conversion circuit 11, the energy storage circuit 12 and the control circuit 13.

Specifically, the circuit system further includes a first external interface card 15 and a second external interface card 16, the first piezoelectric stack 3 is connected with the input end of the rectifier circuit 10 through the first external interface card 15, and the output end of the control circuit 13 is connected with the second piezoelectric stack 6 through the second external interface card 16. All components of the circuit system are integrated into one circuit board respectively.

The piezoelectric stacks can be used for energy collection and vibration control respectively according to the difference of using modes, when one piezoelectric stack is used for energy collection, the other piezoelectric stack is used for vibration control, only one piezoelectric stack is described here, but certainly, a plurality of piezoelectric stacks also can be embedded according to requirements. The mechanical amplifying mechanisms are also different according to the applications of the piezoelectric stacks, when the mechanical amplifying mechanism corresponds to the piezoelectric stack used for energy collection, the mechanical amplifying mechanism is mainly used for amplifying loading force onto the piezoelectric stack so as to increase the deformation of the piezoelectric stack to the maximum extent and improve the energy conversion; and when the mechanical amplifying mechanism corresponds to the piezoelectric stack used for vibration control, the mechanical amplifying mechanism is mainly used for amplifying the stroke of the piezoelectric stack so as to increase the vibration damping amplitude.

In the specific embodiment, the first piezoelectric stack 3 is used for energy collection, the first mechanical amplifying mechanism 2 is used for amplifying loading force onto the first piezoelectric stack 3 so as to increase the deformation of the piezoelectric stack 3 to the maximum extent and improve the energy conversion; and when the second piezoelectric stack 6 is used for vibration control, the second mechanical amplifying mechanism 5 is used for amplifying the stroke of the second piezoelectric stack 6 so as to increase the vibration damping amplitude.

In the embodiment, the mechanical vibration energy is dissipated through piezoelectric energy conversion, but converted energy is stored and reused, on one hand, power is supplied for a logic circuit (namely a circuit consisting of electronic components and parts with low power consumption), and specifically, the logic circuit includes the rectifier circuit 10, the DC-DC voltage conversion circuit 11, the energy storage circuit 12 and the control circuit 13; and on the other hand, active vibration damping is realized, the damping effect of the system is further increased, the vibration damping effect is improved, and the self-powered vibration damping of the system is completely realized by the vibration damper in the embodiment.

The curved leaf spring 4 is mainly used for buffering vibration shock, when the energy collecting mechanism at the end of a vibration source is deformed by vibration excitation, collected energy can be quickly transferred to the vibration control mechanism at the end of the substrate, due to the fact that the mechanical characteristic of the curved leaf spring 4 at the middle part can generate certain phase difference in the transfer process to cause that the vibration of the vibration control always falls behind the energy collecting mechanism, the vibration control mechanism can generate a counter-acting force before vibration come so as to dissipate vibration energy, and thus the vibration damper in the embodiment is of a certain front feedback effect.

The vibration damper in the embodiment is of certain adaptivity, the higher the shock excitation effect of the external environment is, the greater the electromechanical transformation energy is, the more the energy used for vibration control is, and the damping also can be strengthened. The vibration damper in the embodiment can realize vibration resistance and vibration isolation functions, can be applied onto the vibration abatement of some precision sensors (such as radars and precision cameras), and also can be applied to vibration and noise control of some actuators (such as motors), so that the limitation of traditional piezoelectric semi-active control application is overcome. The vibration damper in the present invention further can be used as a single-leg mechanism to expand the multi-degree-of-freedom, so as to be used as a multi-degree-of-freedom platform to realize multi-degree-of-freedom vibration suppression.

In summary, the self-powered vibration damper based on piezoelectricity provided in the embodiment enables the system to be of good vibration damping performance, the self-powered vibration damper is simpler and smaller compared with active control, external power supply is not needed completely, converted energy is utilized sufficiently, and the application field of piezoelectric semi-active control is further expanded. The vibration damper in the embodiment can be used for vibration resistance and also can be used for vibration isolation, the two ways are different in application ways only, but overall workflows are similar, and thus only the mode of vibration resistance is described in detail here.

Specifically, the first mechanical amplifying mechanism 2 and the second mechanical amplifying mechanism 5 are of hexagonal frame structures respectively. Each hexagonal frame structure includes two vertical short plates arranged in parallel relatively and four long plates with same length, two long plates are arranged above and below the two short plates respectively, the first piezoelectric stack 3 is installed between the two short plates of the first mechanical amplifying mechanism 2, and the second piezoelectric stack 6 is installed between the two short plates of the second mechanical amplifying mechanism 5.

The upper surface of the first mechanical amplifying mechanism 2 is connected with the loading platform 1 through screws 9, and the lower surface of the first mechanical amplifying mechanism 2 is connected with the upper surface of the curved leaf spring 4 through screws 9. The first piezoelectric stack 3 is installed at the middle part of the first mechanical amplifying mechanism 2, and the first piezoelectric stack 3 and the loading platform 1 are arranged in parallel. The upper surface of the second mechanical amplifying mechanism 5 is connected with the lower surface of the curved leaf spring 4 through screws 9, and the lower surface of the second mechanical amplifying mechanism 5 is connected with the substrate through screws 9. The second piezoelectric stack 6 is installed at the middle part of the second mechanical amplifying mechanism 5, and the second piezoelectric stack 6 and the loading platform 1 are arranged in parallel. The substrate includes a base platform 8 and a chassis 7, the chassis 7 is fixed onto the base platform 8 through screws 9, and the second mechanical amplifying mechanism 5 is fixed onto the chassis 7 through screws 9.

The embodiment further provides a control method of the self-powered vibration damper based on piezoelectricity, where the control method includes the following steps: when the loading platform 1 is excited by an external environment, exciting force is amplified to the first piezoelectric stack 3 through the first mechanical amplifying mechanism 2, and when the first piezoelectric stack 3 is deformed to the maximum value, the circuit system is conducted; the rectifier circuit 10 is used for converting alternating current of energy conversion into direct current, the DC-DC voltage conversion circuit 11 is matched with the voltage of a subsequent circuit through voltage conversion, the storage of energy is completed by the energy storage circuit 12, after the storage is completed, the control circuit 13 is used for enabling the stored energy to be used for the vibration control of the second piezoelectric stack 6 through a switch control law, namely, a logic switch is controlled to realize energy collection when the maximum deformation of the first piezoelectric stack 3 occurs, and the logic switch is controlled to realize energy release when the maximum deformation of the second piezoelectric stack 6 occurs; the charging battery 14 can obtain partially converted energy and is used for supplying power for the rectifier circuit 10, the DC-DC voltage conversion circuit 11, the energy storage circuit 12 and the control circuit 13; due to the effect of the curved leaf spring 4, the movement of the second mechanical amplifying mechanism 5 always falls behind the loading platform 1, and a counter-acting force is applied to the vibration control mechanism before vibration comes, so that the vibration is further inhibited. When the displacement of the vibration control mechanism reaches the extreme value, the circuit system is disconnected, and then the control for one cycle is completed.

Figure 7:
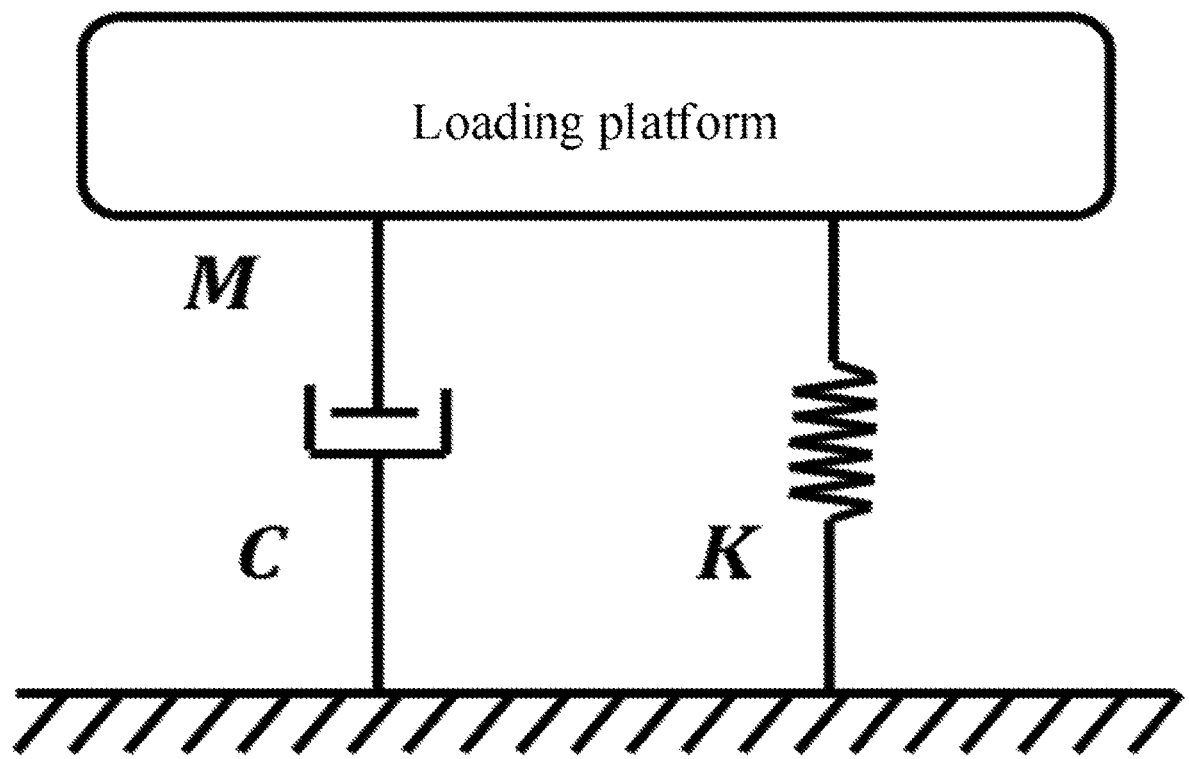
FIG. 7 is a schematic diagram of an original system without a vibration damper.

The semi-active and passive vibration damping principles and the vibration damping principle of an original system without a vibration damper in the embodiment are contrasted as follows:

As shown in FIG. 7, the vibration damping mechanism of the original system is composed of an inherent spring-mass-damping unit of the system, simple passive vibration isolation is realized, and the transmissibility curve function G is as shown in the specification:

$$G = \frac{x_1}{x_0} = \frac{Cs + K}{Ms^2 + Cs + K};$$

In the formula, $x_1$ is the vibration displacement of the loading platform, $x_0$ is a shock excitation amplitude, C is the equivalent damping of the system, K is the equivalent stiffness of the system, M is the mass of the loading platform, $s=j\omega$ is a Laplace transformed complex variable, $\omega$ is a frequency domain coefficient.

Figure 8:
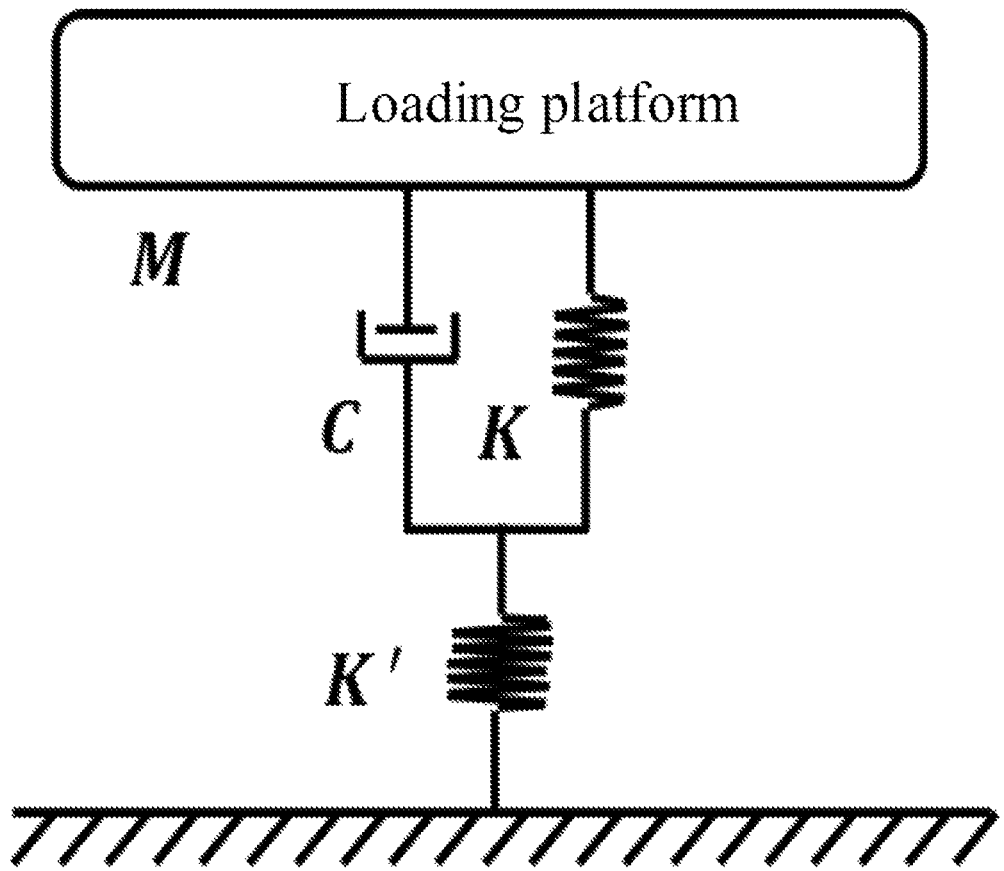
FIG. 8 is a passive vibration damping schematic diagram of the original system with the self-powered vibration damper based on piezoelectricity in the present invention.

As shown in FIG. 8, the schematic diagram, under passive vibration damping (purely mechanical structure), of the vibration damper in the embodiment applied in the original system is equivalent to that an elastic component is serially connected, and the corresponding transmissibility curve function $G_0$ is as shown in the specification:

$$G_0 = \frac{x_2}{x_0} = \frac{Cs + K_0}{Ms^2 + Cs + K_0}, K_0 = \frac{KK'}{K + K'};$$

In the formula, $x_2$ is the vibration displacement of the loading platform 1, under passive vibration damping, of the vibration damper in the embodiment applied in the original system, $K_0$ is the equivalent stiffness of the system after the vibration damper in the embodiment is applied, and K' is the equivalent stiffness of the vibration damper in the embodiment.

Figure 9:
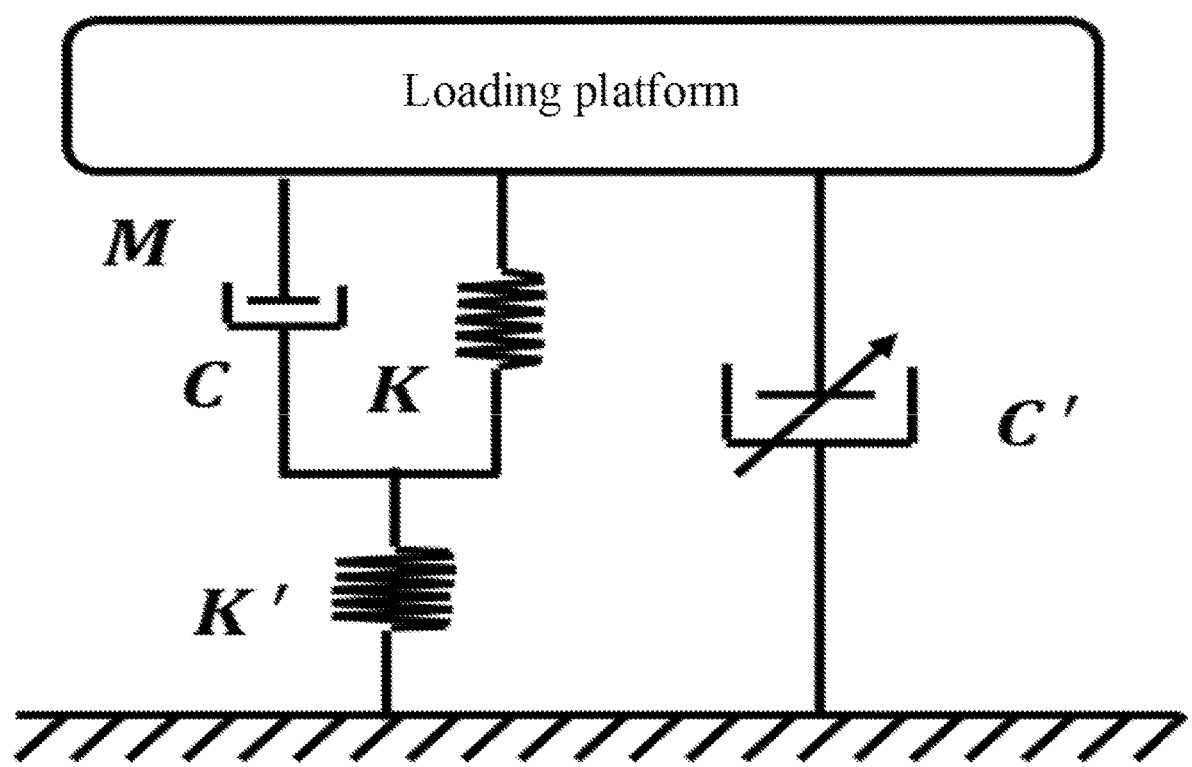
FIG. 9 is a semi-active vibration damping schematic diagram of the original system with the self-powered vibration damper based on piezoelectricity in the present invention.

As shown in FIG. 9, the corresponding transmissibility curve function $G_1$ of the schematic diagram, under semi-active vibration damping, of the vibration damper in the embodiment applied in the original system is as shown in the specification:

$$G_1 = \frac{x_3}{x_0} = \frac{C_0 s + K_0}{Ms^2 + C_0 s + K_0}, C_0 = C + C';$$

In the formula, $x_3$ is the vibration displacement of the loading platform 1, under semi-active vibration damping, of the vibration damper in the embodiment applied in the original system, $C_0$ is the equivalent stiffness of the system after the vibration damper in the embodiment is applied, and C' is the equivalent stiffness of the vibration damper in the embodiment.

Figure 10:
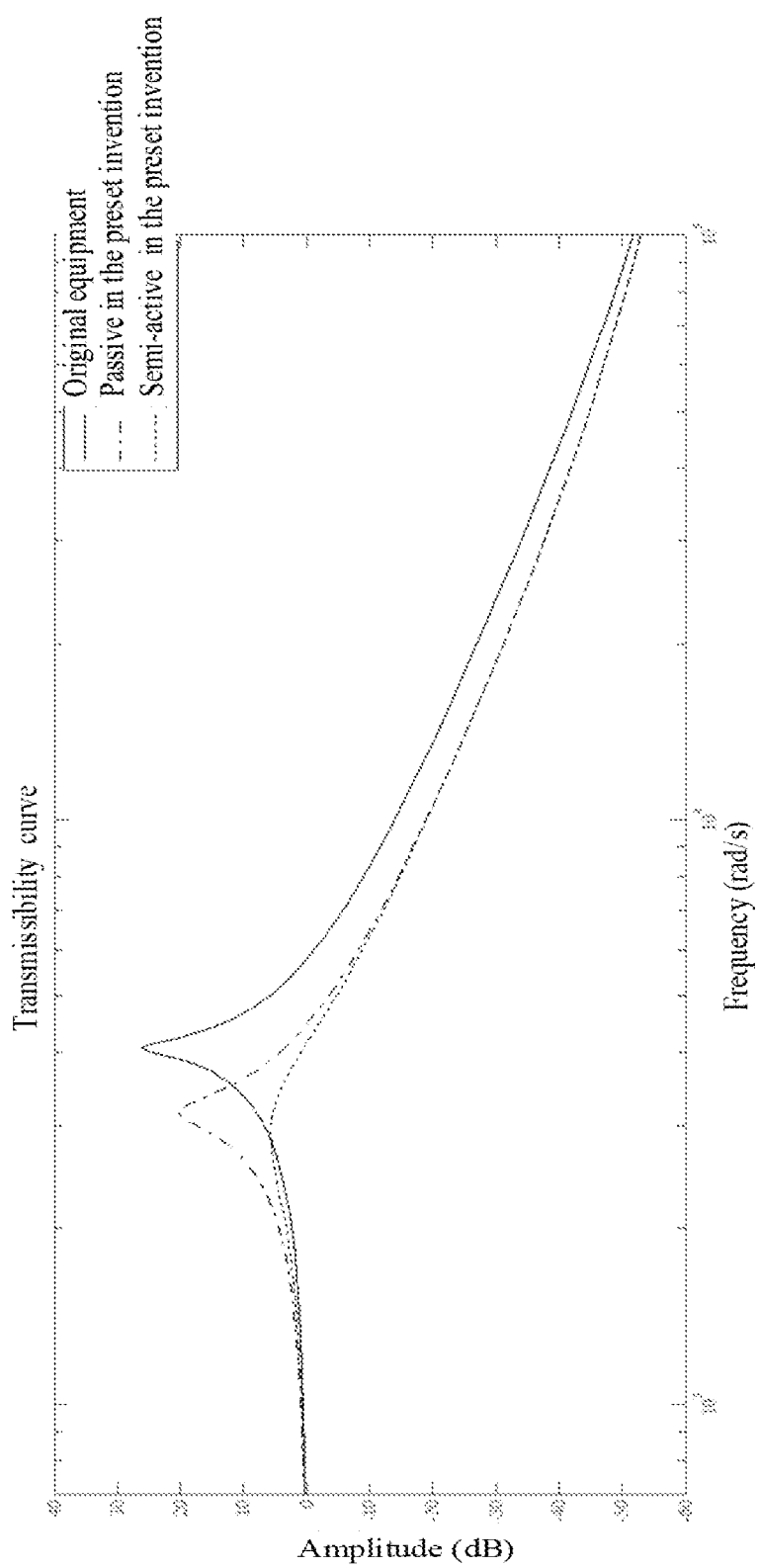
FIG. 10 is a transmissibility curve comparison diagram under three conditions in FIG. 7 to FIG. 9.

FIG. 10 is a transmissibility curve diagram under three conditions in FIG. 7 to FIG. 9. It can be indicated that the transmissibility of the original system is of a relatively high peak value at the position of a resonance peak from full lines in figures, and the inherent frequency of the system is relatively high. It can be indicated that the stiffness of the system is further decreased and the damping is also further promoted due to the fact that an additional stiffness spring is serially connected after the vibration damper in the embodiment is adopted from dash-dotted lines in figures. It can be indicated that the damping effect of the system is further strengthened in cooperation with the semi-active control method on the basis that the vibration damper in the embodiment is adopted from dotted lines in figures, and it can be indicated that the resonance peak value of the system is obviously improved from the transmissibility curve of the system.

Several examples are used for illustration of the principles and implementation methods of the present invention. The description of the embodiments is used to help illustrate the method and its core principles of the present invention. In addition, those skilled in the art can make various modifications in terms of specific embodiments and scope of application in accordance with the teachings of the present invention. In conclusion, the content of this specification shall not be construed as a limitation to the invention.

What is claimed is:

1. A self-powered vibration damper based on piezoelectricity, wherein the self-powered vibration damper comprises a circuit system and a loading platform, an energy collecting mechanism, a curved leaf spring, a vibration control mechanism and a substrate which are connected from top to bottom in sequence, the energy collecting mechanism comprises a first mechanical amplifying mechanism and a first piezoelectric stack installed inside the first mechanical amplifying mechanism, and the vibration control mechanism comprises a second mechanical amplifying mechanism and a second piezoelectric stack installed inside the second mechanical amplifying mechanism; the circuit system comprises a rectifier circuit, a DC-DC voltage conversion circuit, an energy storage circuit, a control circuit and a charging battery, the first piezoelectric stack is connected with an input end of the rectifier circuit, an output end of the rectifier circuit is connected with an input end of the DC-DC voltage conversion circuit, an output end of the DC-DC voltage conversion circuit is connected with an input end of the energy storage circuit and the charging battery, an output end of the energy storage circuit is connected with an input end of the control circuit, an output end of the control circuit is connected with the second piezoelectric stack, and the charging battery is used for supplying power for the rectifier circuit, the DC-DC voltage conversion circuit, the energy storage circuit and the control circuit.

2. The self-powered vibration damper based on piezoelectricity according to claim 1, wherein the first mechanical amplifying mechanism and the second mechanical amplifying mechanism are of hexagonal frame structures respectively.

3. The self-powered vibration damper based on piezoelectricity according to claim 2, wherein an upper surface of the first mechanical amplifying mechanism is connected with the loading platform through screws, and a lower surface of the first mechanical amplifying mechanism is connected with an upper surface of the curved leaf spring through screws.

4. The self-powered vibration damper based on piezoelectricity according to claim 3, wherein the first piezoelectric stack is installed at a middle part of the first mechanical amplifying mechanism, and the first piezoelectric stack and the loading platform are arranged in parallel.

5. The self-powered vibration damper based on piezoelectricity according to claim 4, wherein an upper surface of the second mechanical amplifying mechanism is connected with a lower surface of the curved leaf spring through screws, and a lower surface of the second mechanical amplifying mechanism is connected with the substrate through screws.

6. The self-powered vibration damper based on piezoelectricity according to claim 5, wherein the second piezoelectric stack is installed at the middle part of the second mechanical amplifying mechanism, and the second piezoelectric stack and the loading platform are arranged in parallel.

7. The self-powered vibration damper based on piezoelectricity according to claim 6, wherein the substrate comprises a base platform and a chassis, the chassis is fixed onto the base platform through screws, and the second mechanical amplifying mechanism is fixed onto the chassis through screws.

8. The self-powered vibration damper based on piezoelectricity according to claim 1, wherein the circuit system further comprises a first external interface card and a second external interface card, the first piezoelectric stack is connected with the input end of the rectifier circuit through the first external interface card, and the output end of the control circuit is connected with the second piezoelectric stack through the second external interface card.

9. A control method of the self-powered vibration damper based on piezoelectricity according to claim 1, wherein the control method comprises the following steps:
when the loading platform is excited by an external environment, exciting force is amplified to the first piezoelectric stack through the first mechanical amplifying mechanism, and when the first piezoelectric stack is deformed to a maximum value, the circuit system is conducted;
the rectifier circuit is used for converting alternating current of energy conversion into direct current, the DC-DC voltage conversion circuit is matched with the voltage of a subsequent circuit through voltage conversion, the storage of energy is completed by the energy storage circuit, after the storage is completed, the control circuit is used for enabling the stored energy to be used for the vibration control of the second piezoelectric stack through a switch control law, namely, a logic switch is controlled to realize energy collection when a maximum deformation of the first piezoelectric stack occurs, and the logic switch is controlled to realize energy release when the maximum deformation of the second piezoelectric stack occurs; the charging battery can obtain partially converted energy and is used for supplying power for the rectifier circuit, the DC-DC voltage conversion circuit, the energy storage circuit and the control circuit; and when the displacement of the vibration control mechanism reaches the extreme value, the circuit system is disconnected, and then the control for one cycle is completed.

10. A control method of the self-powered vibration damper based on piezoelectricity according to claim 2, wherein the control method comprises the following steps:
when the loading platform is excited by an external environment, exciting force is amplified to the first piezoelectric stack through the first mechanical amplifying mechanism, and when the first piezoelectric stack is deformed to the maximum value, the circuit system is conducted; the rectifier circuit is used for converting alternating current of energy conversion into direct current, the DC-DC voltage conversion circuit is matched with the voltage of a subsequent circuit through voltage conversion, the storage of energy is completed by the energy storage circuit, after the storage is completed, the control circuit is used for enabling the stored energy to be used for the vibration control of the second piezoelectric stack through a switch control law, namely, a logic switch is controlled to realize energy collection when the maximum deformation of the first piezoelectric stack occurs, and the logic switch is controlled to realize energy release when the maximum deformation of the second piezoelectric stack occurs; the charging battery can obtain partially converted energy and is used for supplying power for the rectifier circuit, the DC-DC voltage conversion circuit, the energy storage circuit and the control circuit; and when the displacement of the vibration control mechanism reaches the extreme value, the circuit system is disconnected, and then the control for one cycle is completed.

11. A control method of the self-powered vibration damper based on piezoelectricity according to claim 3, wherein the control method comprises the following steps:
when the loading platform is excited by an external environment, exciting force is amplified to the first piezoelectric stack through the first mechanical amplifying mechanism, and when the first piezoelectric stack is deformed to the maximum value, the circuit system is conducted; the rectifier circuit is used for converting alternating current of energy conversion into direct current, the DC-DC voltage conversion circuit is matched with the voltage of a subsequent circuit through voltage conversion, the storage of energy is completed by the energy storage circuit, after the storage is completed, the control circuit is used for enabling the stored energy to be used for the vibration control of the second piezoelectric stack through a switch control law, namely, a logic switch is controlled to realize energy collection when the maximum deformation of the first piezoelectric stack occurs, and the logic switch is controlled to realize energy release when the maximum deformation of the second piezoelectric stack occurs; the charging battery can obtain partially converted energy and is used for supplying power for the rectifier circuit, the DC-DC voltage conversion circuit, the energy storage circuit and the control circuit; and when the displacement of the vibration control mechanism reaches the extreme value, the circuit system is disconnected, and then the control for one cycle is completed.

12. A control method of the self-powered vibration damper based on piezoelectricity according to claim 4, wherein the control method comprises the following steps:
when the loading platform is excited by an external environment, exciting force is amplified to the first piezoelectric stack through the first mechanical amplifying mechanism, and when the first piezoelectric stack is deformed to the maximum value, the circuit system is conducted; the rectifier circuit is used for converting alternating current of energy conversion into direct current, the DC-DC voltage conversion circuit is matched with the voltage of a subsequent circuit through voltage conversion, the storage of energy is completed by the energy storage circuit, after the storage is completed, the control circuit is used for enabling the stored energy to be used for the vibration control of the second piezoelectric stack through a switch control law, namely, a logic switch is controlled to realize energy collection when the maximum deformation of the first piezoelectric stack occurs, and the logic switch is controlled to realize energy release when the maximum deformation of the second piezoelectric stack occurs; the charging battery can obtain partially converted energy and is used for supplying power for the rectifier circuit, the DC-DC voltage conversion circuit, the energy storage circuit and the control circuit; and when the displacement of the vibration control mechanism reaches the extreme value, the circuit system is disconnected, and then the control for one cycle is completed.

13. A control method of the self-powered vibration damper based on piezoelectricity according to claim 5, wherein the control method comprises the following steps:
when the loading platform is excited by an external environment, exciting force is amplified to the first piezoelectric stack through the first mechanical amplifying mechanism, and when the first piezoelectric stack is deformed to the maximum value, the circuit system is conducted; the rectifier circuit is used for converting alternating current of energy conversion into direct current, the DC-DC voltage conversion circuit is matched with the voltage of a subsequent circuit through voltage conversion, the storage of energy is completed by the energy storage circuit, after the storage is completed, the control circuit is used for enabling the stored energy to be used for the vibration control of the second piezoelectric stack through a switch control law, namely, a logic switch is controlled to realize energy collection when the maximum deformation of the first piezoelectric stack occurs, and the logic switch is controlled to realize energy release when the maximum deformation of the second piezoelectric stack occurs; the charging battery can obtain partially converted energy and is used for supplying power for the rectifier circuit, the DC-DC voltage conversion circuit, the energy storage circuit and the control circuit; and when the displacement of the vibration control mechanism reaches the extreme value, the circuit system is disconnected, and then the control for one cycle is completed.

14. A control method of the self-powered vibration damper based on piezoelectricity according to claim 6, wherein the control method comprises the following steps:
when the loading platform is excited by an external environment, exciting force is amplified to the first piezoelectric stack through the first mechanical amplifying mechanism, and when the first piezoelectric stack is deformed to the maximum value, the circuit system is conducted; the rectifier circuit is used for converting alternating current of energy conversion into direct current, the DC-DC voltage conversion circuit is matched with the voltage of a subsequent circuit through voltage conversion, the storage of energy is completed by the energy storage circuit, after the storage is completed, the control circuit is used for enabling the stored energy to be used for the vibration control of the second piezoelectric stack through a switch control law, namely, a logic switch is controlled to realize energy collection when the maximum deformation of the first piezoelectric stack occurs, and the logic switch is controlled to realize energy release when the maximum deformation of the second piezoelectric stack occurs; the charging battery can obtain partially converted energy and is used for supplying power for the rectifier circuit, the DC-DC voltage conversion circuit, the energy storage circuit and the control circuit; and when the displacement of the vibration control mechanism reaches the extreme value, the circuit system is disconnected, and then the control for one cycle is completed.

15. A control method of the self-powered vibration damper based on piezoelectricity according to claim 7, wherein the control method comprises the following steps:
when the loading platform is excited by an external environment, exciting force is amplified to the first piezoelectric stack through the first mechanical amplifying mechanism, and when the first piezoelectric stack is deformed to the maximum value, the circuit system is conducted; the rectifier circuit is used for converting alternating current of energy conversion into direct current, the DC-DC voltage conversion circuit is matched with the voltage of a subsequent circuit through voltage conversion, the storage of energy is completed by the energy storage circuit, after the storage is completed, the control circuit is used for enabling the stored energy to be used for the vibration control of the second piezoelectric stack through a switch control law, namely, a logic switch is controlled to realize energy collection when the maximum deformation of the first piezoelectric stack occurs, and the logic switch is controlled to realize energy release when the maximum deformation of the second piezoelectric stack occurs; the charging battery can obtain partially converted energy and is used for supplying power for the rectifier circuit, the DC-DC voltage conversion circuit, the energy storage circuit and the control circuit; and when the displacement of the vibration control mechanism reaches the extreme value, the circuit system is disconnected, and then the control for one cycle is completed.

16. A control method of the self-powered vibration damper based on piezoelectricity according to claim 8, wherein the control method comprises the following steps:
when the loading platform is excited by an external environment, exciting force is amplified to the first piezoelectric stack through the first mechanical amplifying mechanism, and when the first piezoelectric stack is deformed to the maximum value, the circuit system is conducted; the rectifier circuit is used for converting alternating current of energy conversion into direct current, the DC-DC voltage conversion circuit is matched with the voltage of a subsequent circuit through voltage conversion, the storage of energy is completed by the energy storage circuit, after the storage is completed, the control circuit is used for enabling the stored energy to be used for the vibration control of the second piezoelectric stack through a switch control law, namely, a logic switch is controlled to realize energy collection when the maximum deformation of the first piezoelectric stack occurs, and the logic switch is controlled to realize energy release when the maximum deformation of the second piezoelectric stack occurs; the charging battery can obtain partially converted energy and is used for supplying power for the rectifier circuit, the DC-DC voltage conversion circuit, the energy storage circuit and the control circuit; and when the displacement of the vibration control mechanism reaches the extreme value, the circuit system is disconnected, and then the control for one cycle is completed.

* * * * *